(12) United States Patent
Park et al.

(10) Patent No.: US 9,882,409 B2
(45) Date of Patent: Jan. 30, 2018

(54) SYSTEM AND METHOD FOR CORRECTING SOC OF BATTERY

(71) Applicant: LG CHEM, LTD., Seoul (KR)

(72) Inventors: Jeong Seok Park, Daejeon (KR); Sung Yul Yoon, Daejeon (KR); Tae Shin Cho, Daejeon (KR); Young Bo Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 106 days.

(21) Appl. No.: 14/917,346

(22) PCT Filed: Oct. 20, 2015

(86) PCT No.: PCT/KR2015/011098
§ 371 (c)(1),
(2) Date: Mar. 8, 2016

(87) PCT Pub. No.: WO2016/064171
PCT Pub. Date: Apr. 28, 2016

(65) Prior Publication Data
US 2016/0301234 A1  Oct. 13, 2016

(30) Foreign Application Priority Data

Oct. 21, 2014 (KR) .................. 10-2014-0142609
Oct. 21, 2014 (KR) .................. 10-2014-0142610

(51) Int. Cl.
*H02J 7/00* (2006.01)
*H01M 10/44* (2006.01)
(Continued)

(52) U.S. Cl.
CPC .......... *H02J 7/0075* (2013.01); *B60L 3/0046* (2013.01); *B60L 11/1862* (2013.01);
(Continued)

(58) Field of Classification Search
CPC ......... H02J 7/0075; H02J 7/00; B60L 3/0046; B60L 11/1862; G01R 31/3606;
(Continued)

(56) References Cited

U.S. PATENT DOCUMENTS 6,868,318 B1 * 3/2005 Cawthorne .......... B60L 11/005
307/10.1
2009/0118962 A1  5/2009 Heap et al.
(Continued)

FOREIGN PATENT DOCUMENTS

DE    10 2012 208 464 A1   11/2013
EP       2 055 587 A2      5/2009
(Continued)

OTHER PUBLICATIONS

Extended European Search Report for Appl. No. 15837076.7 dated Dec. 21, 2016.
(Continued)

*Primary Examiner* — Nha Nguyen
(74) *Attorney, Agent, or Firm* — Birch, Stewart, Kolasch & Birch, LLP

(57) ABSTRACT

Provided are system and method for correcting a state-of-charging (SOC) of a battery. The system for correcting the SOC of the battery includes an SOC measuring unit measuring an SOC value of the battery, a storage unit storing preset operation ranges to determine whether charging/discharging of the battery is compensated, a determining unit determining an operation range corresponding to the SOC value of the battery among the preset operation ranges, and an SOC correcting unit adjusting a dead band in charging/discharging directions or charging/discharging power according to the result determined in the determining unit to correct the SOC value of the battery.

20 Claims, 18 Drawing Sheets

(51) Int. Cl.
*G01R 31/36* (2006.01)
*H01M 10/48* (2006.01)
*B60L 11/18* (2006.01)
*B60L 3/00* (2006.01)
*H01M 10/0525* (2010.01)

(52) U.S. Cl.
CPC ........ *G01R 31/3606* (2013.01); *H01M 10/44* (2013.01); *H01M 10/446* (2013.01); *H01M 10/48* (2013.01); *H02J 7/00* (2013.01); *H01M 10/0525* (2013.01); *H01M 2220/20* (2013.01); *Y02T 10/705* (2013.01); *Y02T 10/7011* (2013.01); *Y02T 10/7044* (2013.01)

(58) Field of Classification Search
CPC .... H01M 10/48; H01M 10/446; H01M 10/44; H01M 2220/20; H01M 10/0525; Y02T 10/7044; Y02T 10/705; Y02T 10/7011
See application file for complete search history.

(56) References Cited

U.S. PATENT DOCUMENTS

| | | |
|---|---|---|
| 2009/0250277 A1 | 10/2009 | Grand et al. |
| 2010/0152938 A1 | 6/2010 | Aoki et al. |
| 2011/0115439 A1 | 5/2011 | Kim |
| 2011/0273129 A1* | 11/2011 | Coe .................. H02J 7/007 320/101 |
| 2012/0161707 A1 | 6/2012 | Kim |
| 2013/0113433 A1* | 5/2013 | Shibata ............. B60L 11/14 320/134 |
| 2014/0292080 A1 | 10/2014 | Markowz et al. |
| 2015/0015213 A1* | 1/2015 | Brooks ................ H02J 3/24 320/137 |
| 2015/0142236 A1 | 5/2015 | Schmidt et al. |
| 2016/0079778 A1* | 3/2016 | Howe ................. H02J 3/32 320/112 |
| 2016/0254683 A1* | 9/2016 | Matsumoto ........ H02J 7/0014 320/118 |

FOREIGN PATENT DOCUMENTS

| | | |
|---|---|---|
| EP | 2 145 808 A1 | 1/2010 |
| JP | 2014-112980 A | 6/2014 |
| KR | 10-2011-0054135 A | 5/2011 |
| KR | 10-1337576 B1 | 12/2013 |
| KR | 10-2014-0073627 A | 6/2014 |

OTHER PUBLICATIONS

Liu, H. et al, "Decentralized Vehicle-to-Grid Control for Primary Frequency Regulation Considering Charging Demands," IEEE Transactions on Power Systems, Aug. 2013, vol. 28, No. 3, pp. 3480-3489.

* cited by examiner

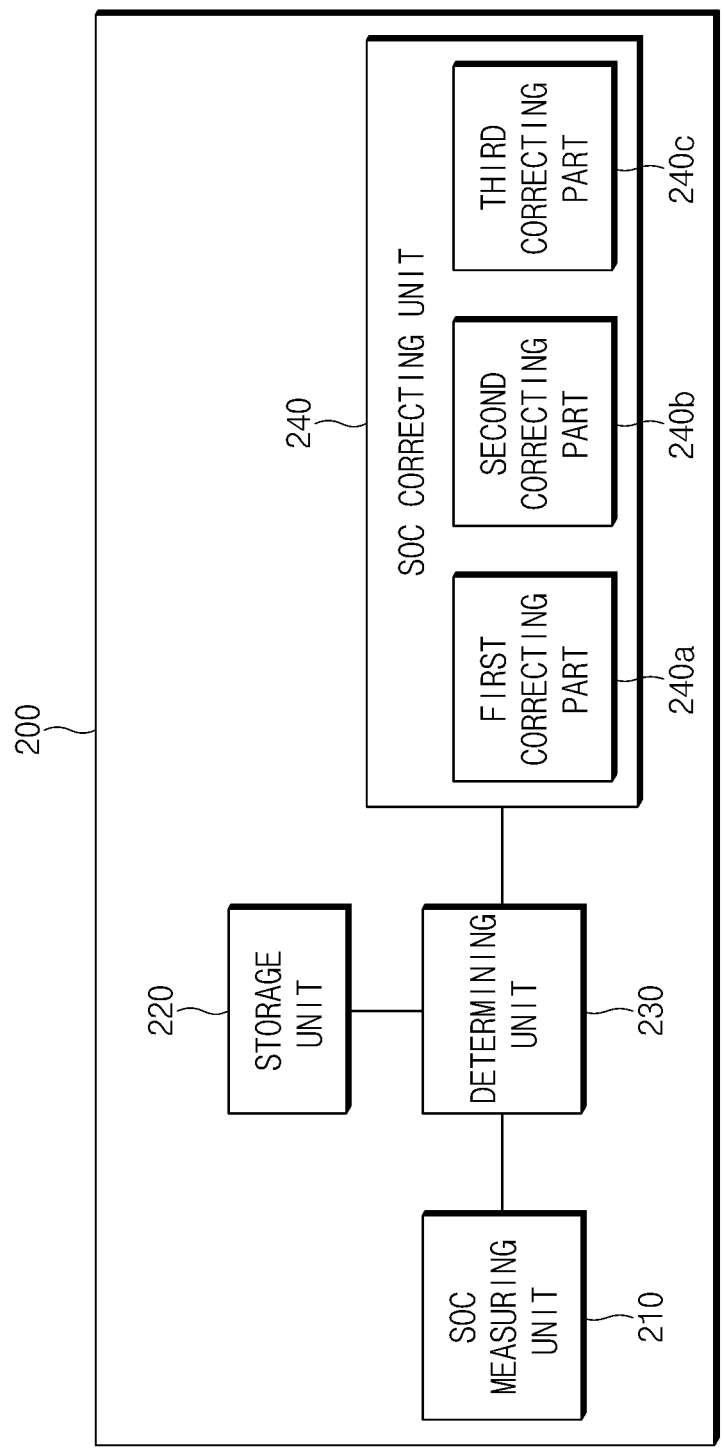

SYSTEM AND METHOD FOR CORRECTING SOC OF BATTERY

CROSS-REFERENCE TO RELATED APPLICATIONS

This application claims the benefit of Korean Patent Application Nos. 10-2014-0142609, filed on Oct. 21, 2014, and 10-2014-0142610, filed on Oct. 21, 2014, in the Korean Intellectual Property Office, the disclosure of which is incorporated herein in its entirety by reference.

TECHNICAL FIELD

The present invention relates to a system and method for correcting a state-of-charging (SOC) of a battery, and more particularly, to a system and method for maintaining an SOC value to a predetermined range while a battery is charged and discharged.

BACKGROUND ART

Recently, due to the exhaustion of fossil energy and environmental pollution, the interest in electric products which are capable of being driven by using electric energy without the use of fossil energy is growing more and more.

Accordingly, with the increasing development and demand of mobile device, electric vehicles, hybrid vehicles, power storage devices, uninterrupted power supplies, and the like, the demands of second batteries as energy sources are rapidly increasing, and also demand forms are being diversified.

Thus, more studies on secondary batteries are being actively carried out to cope with such diverse demands. In general, secondary batteries include nickel-cadmium batteries, nickel-hydrogen batteries, lithium ion batteries, and lithium ion polymer batteries.

Such secondary batteries are classified into lithium based batteries and nickel-hydrogen based batteries. Lithium-based batteries are mainly used for small products such as digital cameras, P-DVDs, MP3Ps, cellular phones, PDAs, portable game devices, power tools, and E-bikes, and nickel hydrogen-based batteries are mainly applied to and used for large products such as electric vehicles or hybrid electric vehicles, which need high output.

To drive electric vehicles or hybrid electric vehicles, a motor has to be driven, which requires high output. Also, in case of the power storage devices for supplying power to buildings or certain areas, a large amount of power that is enough to satisfy power demands has to be supplied. As described above, to provide power having high output or large capacity, a plurality of batteries, each of which is composed of a unit cell assembly, are connected in series or parallel to each other to supply desired output or power.

However, in case of the battery in which a plurality of battery cells are connected to each other, there may be made differences among charge capacities of the unit cells after the unit cells are repeatedly charged and discharged. If the discharging of the battery is continued in the state where the difference in charging capacity exists, it may be difficult to stably operate the battery because a specific unit cell having low charging capacity is overdischarged. On the other hand, if the charging of the battery is continued in the state where the difference in charging capacity exists, a specific unit cell may be overcharged to disturb the safety of the battery.

The difference in charging capacity may cause the overcharging or overdischarging of some of the unit cells. As a result, due to the above-described problem, power may not be stably supplied to a load (e.g., an electric motor, a power grid, and the like).

To solve this problem, various methods for continuously monitoring the charge capacity of the battery cells to balance the charge capacity of the battery cells to a constant level are required.

DISCLOSURE OF THE INVENTION

Technical Problem

An object of the present invention is to provide a system and method for correcting a battery SOC, which is capable of more efficiently correcting a battery SOC value to a predetermined range by adjusting a dead band in charging/discharging directions or adjusting charging/discharging power while charging/discharging a battery.

The object of the present invention is not limited to the aforesaid, but other objects not described herein will be clearly understood by those skilled in the art from descriptions below.

Technical Solution

According to an aspect of the present invention, there is provided a system for correcting a state-of-charging (SOC) of a battery, the system including: an SOC measuring unit measuring an SOC value of the battery; a storage unit storing preset operation ranges to determine whether charging/discharging of the battery is compensated; a determining unit determining an operation range corresponding to the SOC value of the battery among the preset operation ranges; and an SOC correcting unit adjusting a dead band in charging/discharging directions or charging/discharging power according to the result determined in the determining unit to correct the SOC value of the battery.

According to another aspect of the present invention, there is provided a method for correcting a state-of-charging (SOC) of a battery, the method including: measuring an SOC value of the battery; comparing the SOC value to preset operation ranges to determine an operation range corresponding to the SOC value; and adjusting a dead band in charging/discharging directions or charging/discharging power according to conditions corresponding to the operation range which corresponds to the SOC value to correct the SOC value of the battery.

Advantageous Effects

According to the present invention, the SOC correction may be performed by adjusting the dead band section in the charging/discharging directions or adjusting the charging/discharging power while charging/discharging the battery to maintain the SOC value of the battery within a predetermined range. In addition, the probability that the SOC value of the battery reaches about 100% or about 0% may be reduced, and the battery may be reduced in capacity when the battery is designed.

BRIEF DESCRIPTION OF THE DRAWINGS

FIG. 5 is a block diagram of a system for correcting an SOC of a battery according to another embodiment of the present invention.

MODE FOR CARRYING OUT THE INVENTION

Figure 1:
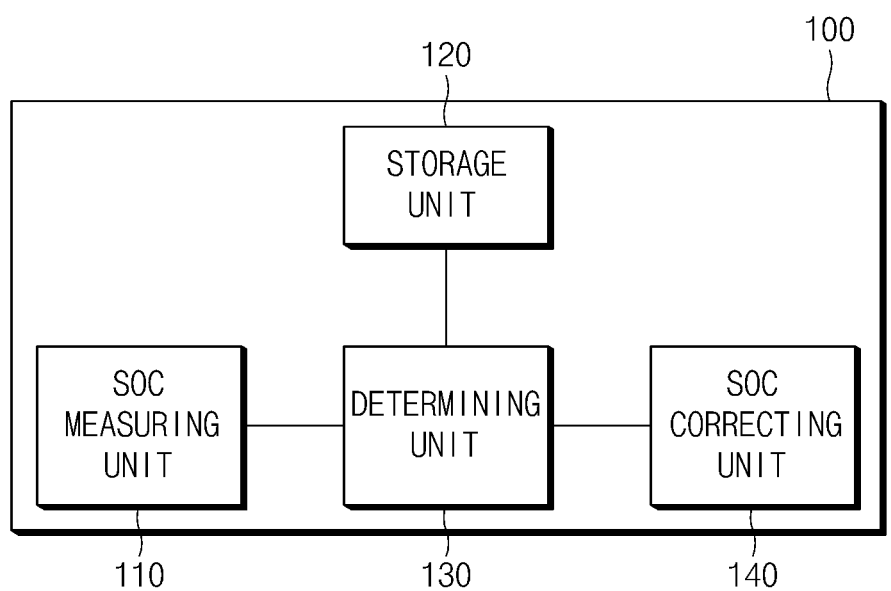
FIG. 1 is a block diagram of a system for correcting an SOC of a battery according to an embodiment of the present invention.

Terms or words used in the specification and claims should not be construed as limited to a lexical meaning, and should be understood as appropriate notions by the inventor based on that he/she is able to define terms to describe his/her invention in the best way to be seen by others.

Therefore, the embodiments described in this specification and the constructions illustrated in the drawings are only preferred embodiments of the present invention, and may not describe the technical spirit thoroughly. Accordingly, it should be understood that various equivalents and modifications which can substitute the embodiments may be provided at a point of application time of this specification. Moreover, detailed descriptions related to well-known functions or configurations will be ruled out in order not to unnecessarily obscure subject matters of the present invention.

Hereinafter, a system and method for correcting an SOC of a battery according to a preferred embodiment of the present invention will be described in detail with reference to the accompanying drawings.

FIG. 1 is a block diagram of a system for correcting a state-of-charging (SOC) of a battery according to an embodiment of the present invention.

Referring to FIG. 1, a system 100 for correcting an SOC of a battery includes an SOC measuring unit 110, a storage unit 120, a determining unit 130, and an SOC correcting unit 140.

First, the SOC measuring unit 110 measures an SOC value of the battery which is charged through power supplied from a power producing device of a battery energy storage system (BESS). The SOC measuring unit 110 may measure the SOC value of the battery at every preset unit time.

Also, the SOC value of the battery, which is measured in the SOC measuring unit 110, is stored in the storage unit 120.

A plurality of operation ranges corresponding to SOC values of the battery are stored in the storage unit 120. The plurality of operation ranges may be previously set to determine whether the charging/discharging of the battery is compensated. The operation range corresponding to the SOC value of the battery may be set to an operation range that are adequate for a lifecycle of the BESS.

For example, if an operation range that is discussed with the company of customer is about 20% to about 80% of the SOC value, and an operation range adequate for the lifecycle of the BESS is about 40% to about 60% of the SOC value, the operation ranges may be set to operation ranges for a reference value. Here, if an operation range is about 70% to about 100% of the SOC value of the battery, which is measured in the SOC measuring unit 110, the operation range may be defined as a first operation range. If an operation range is about 30% to about 70% of the SOC value, the operation range may be defined as a second operation range, and if an operation range is about 0% to about 30% of the SOC value, the operation range may be defined as a third operation range. Since there are many demands to match the SOC value of the battery to a level of about 50%, the second operation range may be determined as a normal range. In this specification, although the value of each of the operation ranges is set as described above, the present invention is not limited thereto. For example, the values of the operation ranges may be changed according to a state of the battery or surrounding environments.

The determining unit 130 may compare the measured SOC value of the battery to the plurality of operation ranges stored in the storage unit 120 to determine an operation range corresponding to the measured SOC value of the battery among the plurality of operation ranges.

The SOC correcting unit 140 stores correction values corresponding to the plurality of operation ranges.

The correction values may be set to correction values different from each other according to the operation ranges. The first correction value corresponding to the first operation range may include conditions for increasing a dead band in a charging direction or decreasing the dead band in a discharging direction.

The second correction value corresponding to the second operation range may include conditions for increasing the dead band in the charging/discharging directions or maintaining the present state, and the third correction value corresponding to the third operation range may include conditions for decreasing the dead band in the charging direction or increasing the dead band in the discharging direction.

The SOC correcting unit 140 adjusts the dead band section according to the result determined in the determining unit 130 to correct the SOC value of the battery.

For example, when the measured SOC value of the battery corresponds to the first operation range, the SOC correcting unit 140 increases the dead band in the charging direction or decreases the dead band in the discharging direction. Since the second operation range corresponds to the normal range, when it is determined that the measured SOC value of the battery corresponds to the second operation range, the present state is maintained. Here, even through the measured SOC value of the battery corresponds to the normal range, the dead band may be increased in the charging direction in consideration of efficiency of the battery.

When the measured SOC value of the battery corresponds to the third operation range, the dead band is decreased in the charging direction or increased in the discharging direction.

As described above, the dead band section in the charging/discharging directions may be adjusted to correct the SOC value of the battery while charging/discharging the battery, thereby maintaining the SOC value within a predetermined range.

Figure 2:
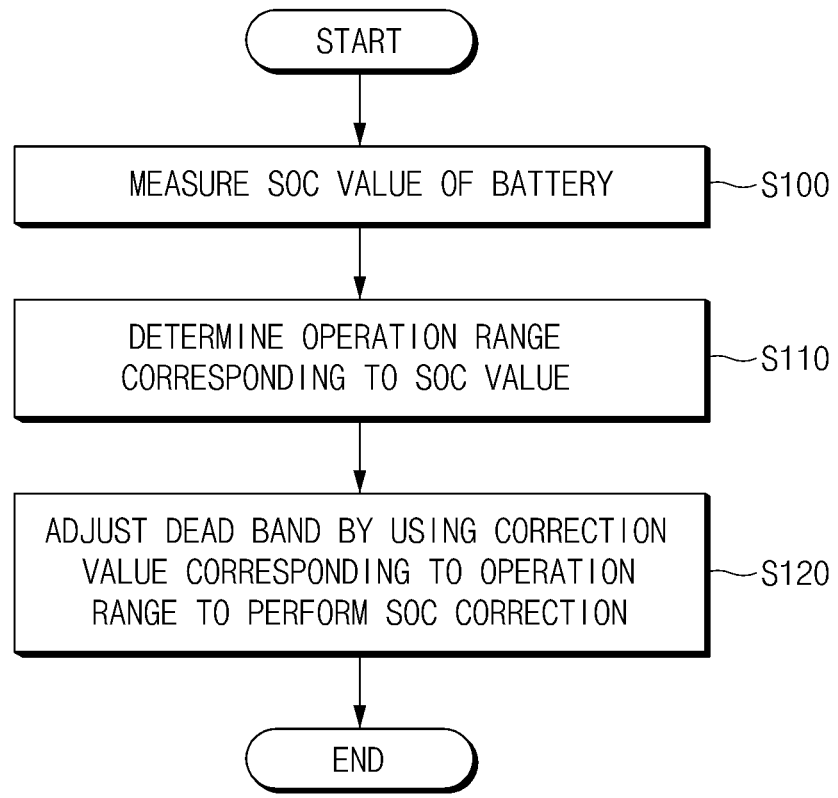
FIG. 2 is a flowchart of a method for correcting the SOC of the battery according to an embodiment of the present invention.

FIG. 2 is a flowchart of a method for correcting the SOC of the battery according to an embodiment of the present invention.

Referring to FIG. 2, the SOC measuring unit 110 measures an SOC value of a battery which is charged through power supplied from the power producing device of the BESS (S100). The SOC value of the battery may be measured at every preset unit time.

Figure 3:
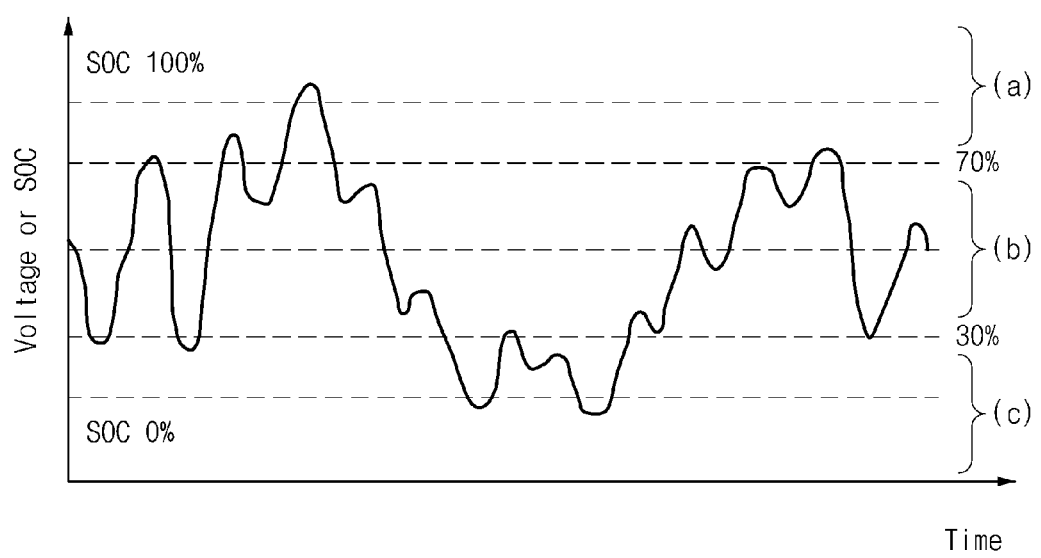
FIG. 3 is a graph of a variation in SOC depending on charging/discharging sections of the battery according to an embodiment of the present invention.

FIG. 3 is a graph of SOC values of the battery, which are measured at every unit time. Referring to FIG. 3, it is seen that an SOC value of the battery is frequently changed in a range of about 0% to about 100%.

The determining unit (130) compares the measured SOC value of the battery to the plurality of operation ranges stored in the storage unit (see reference numeral 120 of FIG. 1) to determine an operation range corresponding to the measured SOC value among the plurality of operation ranges (S110).

The plurality of operation ranges corresponding to the SOC values of the battery are stored in the storage unit 120. The plurality of operation ranges may be previously set to determine whether the charging/discharging of the battery is compensated.

The plurality of operation ranges will be described with reference to the graph of FIG. 3. Here, an x-axis in the graph may denote a time, and a y-axis in the graph may denote an SOC value of the battery.

Referring to FIG. 3, the SOC value of the battery may be partitively set to ranges of about 70% to about 100% (a first operation range: a), about 30% to about 70% (a second operation range: b), and about 0% to about 30% (a third operation range: c).

Since there are many demands to match the present SOC value of the battery to a level of about 50%, it may be determined that the first operation state a is defined as an overcharged state, the second operation range b is defined as a normal range, and the third operation range c is defined as an overcharged state. In this specification, although the value of each of the operation ranges is set as described above, the present invention is not limited thereto. For example, the values of the operation ranges may be changed in consideration of capacity, charging efficiency, discharging resistance, and the like of the battery.

Next, the SOC correcting unit 140 performs SOC correction by using a correction value corresponding to the operation range which corresponds to the measured SOC value (S120). The SOC correction may adjust the dead band section in the charging/discharging directions according to the result determined in the operation S110.

The SOC correction value will be described with reference to the graphs of FIG. 4A to 4C.

Figure 4A:
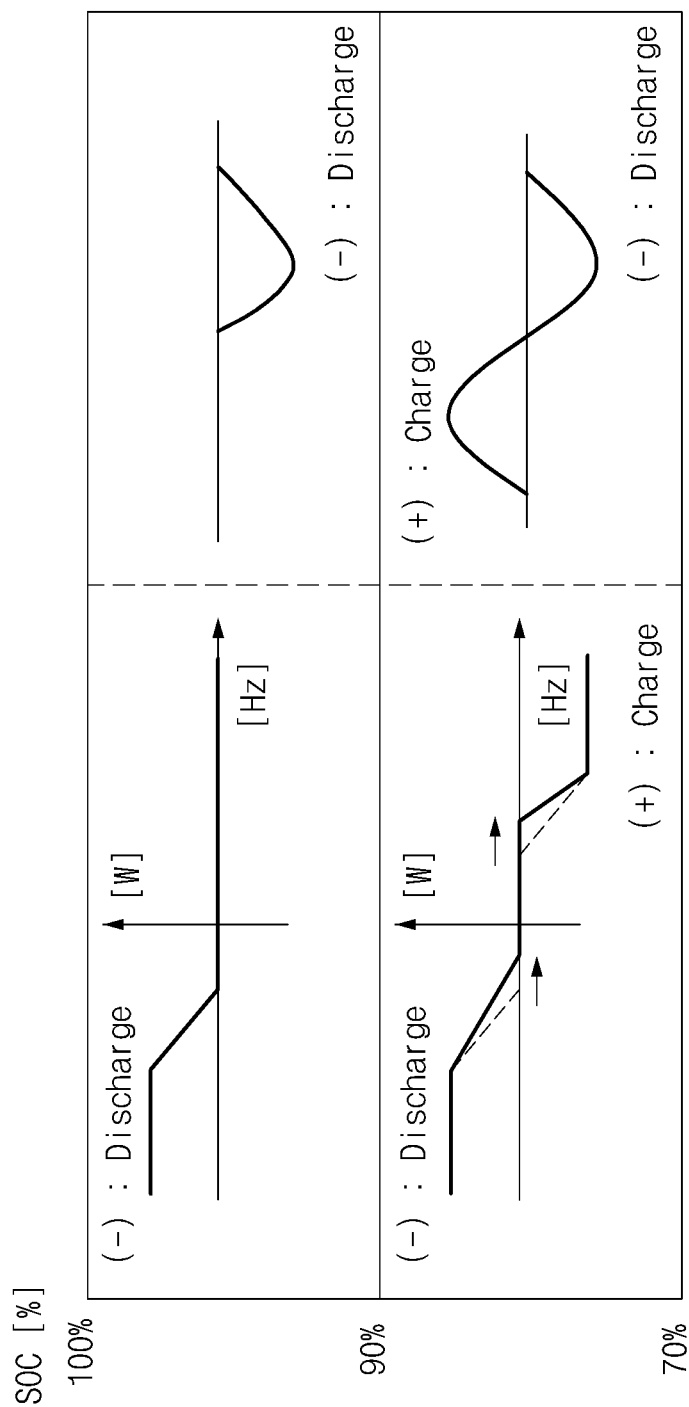
FIGS. 4A to 4C are graphs of the method for correcting the SOC of the battery according to an embodiment of the present invention.

FIG. 4A illustrates a case in which the SOC value of the battery, which is measured in the SOC measuring unit corresponds to the first operation range a of about 70% to about 100%. When the measured SOC value of the battery corresponds to the first operation range, the dead band is increased in the charging direction or decreased in the discharging direction.

When the dead band is increased in the charging direction, a range of the dead band in the charging direction is expanded to reduce a frequency correction signal range corresponding to the range of the dead band. Also, the number of power signal applied to the battery is decreased. Also, probability that the SOC value of the battery reaches about 100% is reduced.

When the dead band in the discharging direction is decreased, the range of the dead band in the discharging direction is decreased, and the frequency correction signal range corresponding to the range of the dead band is increased. Also, the number of power signal applied to the battery is increased. Also, probability that the SOC value of the battery reaches about 100% is reduced.

Figure 4B:
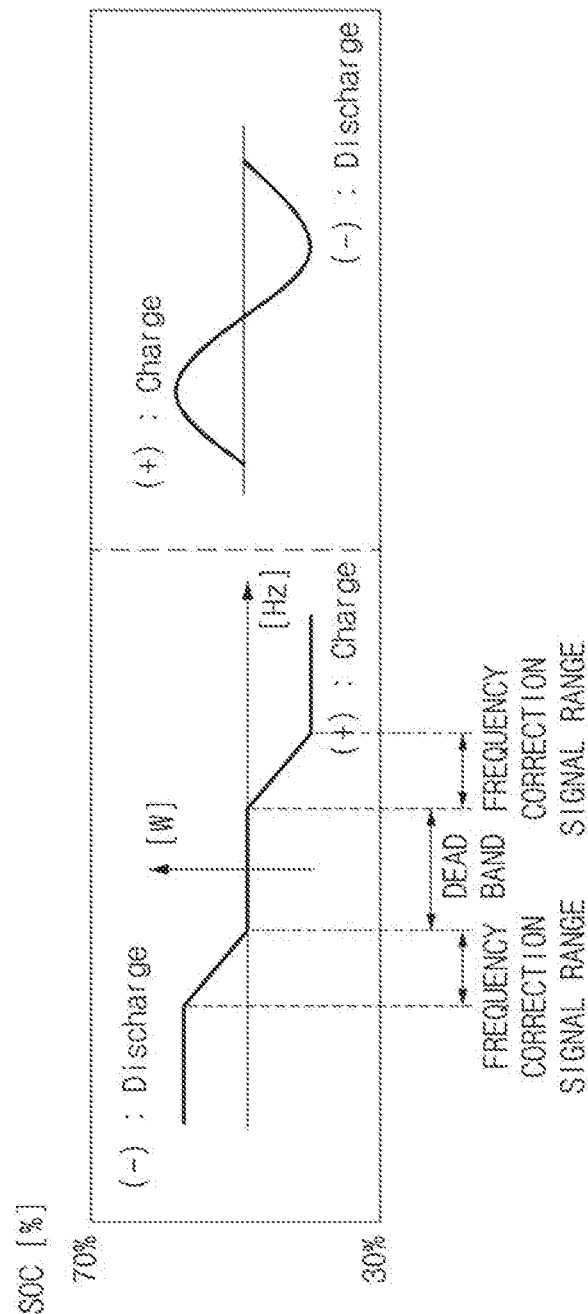

Referring to FIG. 4B, when the SOC value of the battery, which is measured in the SOC measuring unit 110 corresponds to the second operation range b of about 30% to about 70%, the present state is maintained, or the dead band in the charging/discharging directions is increased in consideration of the efficiency of the battery, as illustrated in FIG. 4B.

Figure 4C:
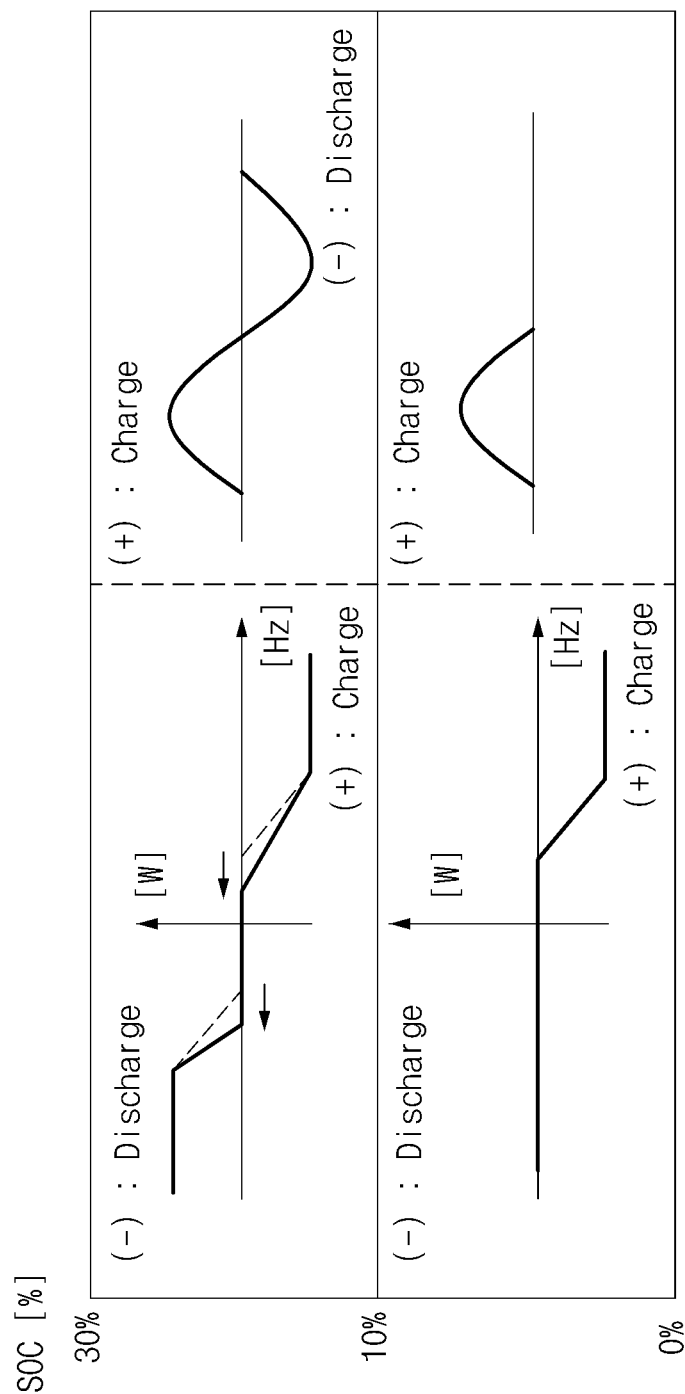

Referring to FIG. 4C, when the SOC value of the battery, which is measured in the SOC measuring unit 110 corresponds to the third operation range c of about 0% to about 30%, the dead band in the charging direction is decreased, the dead band in the discharging direction is increased, as illustrated FIG. 4C.

When the dead band in the charging direction is decreased, the range of the dead band is decreased, and the frequency correction signal range corresponding to the range of the dead band is increased. Also, the number of power signal applied to the battery is increased, and probability that the SOC value of the battery reaches about 0% is reduced.

As described above, the SOC value of the battery may be measured, and the operation range corresponding to the measured SOC value may be determined. Then, the dead band section may be adjusted by using the correction value corresponding to the operation range to maintain the SOC value within a predetermined range.

FIG. 5 is a block diagram of a system 200 for correcting an SOC of a battery according to another embodiment of the present invention.

Referring to FIG. 5, a system 200 for correcting an SOC of a battery includes an SOC measuring unit 210, a storage unit 220, a determining unit 230, and an SOC correcting unit 240.

First, the SOC measuring unit 210 measures an SOC value of the battery which is charged through power supplied from a power producing device of a battery energy storage system (BESS). The SOC value of the battery may be measured at every preset unit time.

The SOC value of the battery, which is measured in the SOC measuring unit 210, is stored in the storage unit 220.

A plurality of operation ranges corresponding to SOC values of the battery are stored in the storage unit 220. The plurality of operation ranges may be previously set to determine whether the charging/discharging of the battery is compensated. The operation ranges corresponding to the SOC value of the battery may be set to operation ranges that are adequate for a lifecycle of the BESS.

For example, if an operation range that is discussed with the company of customer is about 20% to about 80% of the SOC value, and an operation range adequate for a lifecycle of the BESS is about 40% to about 60% of the SOC value, the operation ranges may be set to operation ranges for a reference value. Here, if an operation range is about 70% to about 100% of the SOC value of the battery, which is measured in the SOC measuring unit 210, the operation range may be set to a first operation range. If an operation range is about 30% to about 70% of the SOC value, the operation range may be set to a second operation range, and if an operation range is about 0% to about 30% of the SOC value, the operation range may be set to a third operation range. Since there are many demands to match the SOC value of the battery to a level of about 50%, the second operation range may be determined as a normal range. In this specification, although the value of each of the operation ranges is set as described above, the present invention is not limited thereto. For example, the values of the operation ranges may be changed according to a state of the battery or surrounding environments.

The determining unit 230 determines an operation range corresponding to the measured SOC value of the battery among the plurality of operation ranges.

The SOC correcting unit 240 stores correction values corresponding to the plurality of operation ranges, respectively.

The SOC correcting unit 240 includes a first correcting part 240a, a second correcting part 240b, and a third correcting part 240c. The correcting parts have correction values obtained by using charging/discharging power adjusting manners different from each other, respectively.

The first correcting part 240a includes conditions for increasing or decreasing charging/discharging power in an exponential form. The second correcting part 240b includes conditions for increasing or decreasing the charging/discharging power in a stepped form. Also, a third correcting part 240c includes conditions for increasing or decreasing the charging/discharging power at a predetermined ratio.

The SOC correcting unit 240 adjusts the charging/discharging power according to the result determined in the determining unit 230 to correct the SOC value of the battery.

For example, when it is determined that the SOC value of the battery corresponds to the first operation range by the determining unit 230, one correcting part of the SOC correcting unit 240 is selected to perform the SOC correction by using the correction value of the selected correcting part, which corresponds to the first operation range.

When the measured SOC value of the battery corresponds to the first operation range, the charging power is decreased, or the discharging power is increased. Here, the charging/discharging power may be increased or decreased in the exponential or stepped form or at the predetermined ratio.

Since the second operation range corresponds to the normal range, when it is determined that the measured SOC value of the battery corresponds to the second operation range, the present state is maintained.

When the measured SOC value of the battery corresponds to the third operation range, the charging power is increased, or the discharging power is decreased. Here, the charging/discharging power may be increased or decreased in the exponential or stepped form or at the predetermined ratio.

As described above, since the charging/discharging power is adjusted according to the various conditions to perform the SOC correction, the SOC value of the battery may be maintained within a predetermined range. In addition, the probability that the SOC value of the battery reaches about 100% or about 0% may be reduced, and the battery may be reduced in capacity when the battery is designed.

Figure 6:
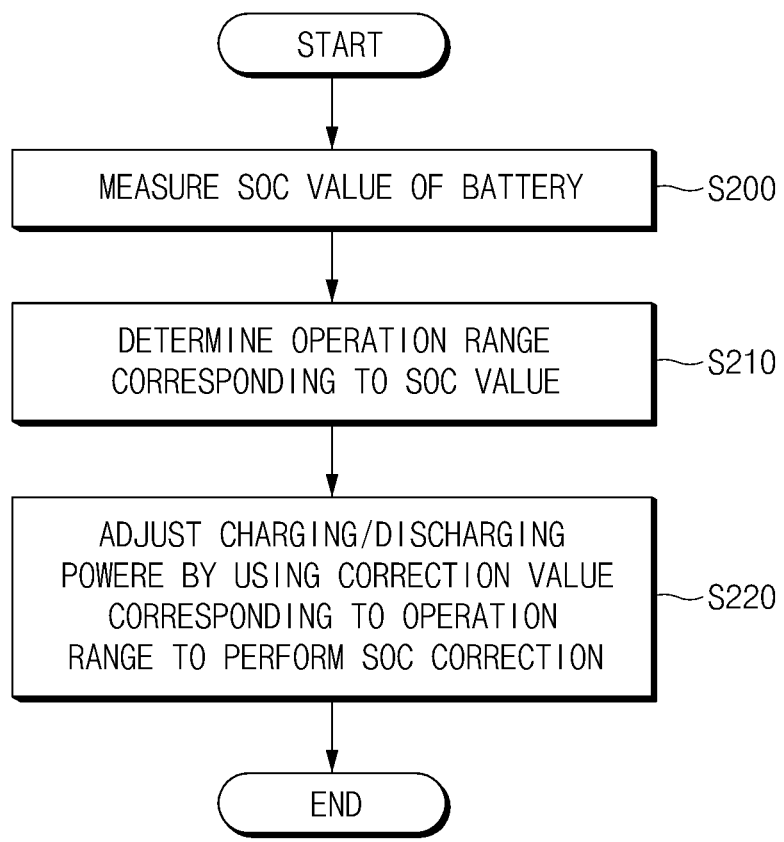
FIG. 6 is a flowchart of a method for correcting the SOC of the battery according to another embodiment of the present invention.

FIG. 6 is a flowchart of a method for correcting the SOC of the battery according to another embodiment of the present invention.

Referring to FIG. 6, an SOC value of the battery which is charged through power supplied from a power producing device of a battery energy storage system (BESS) is measured (S200). The SOC value of the battery may be measured at every preset unit time. FIG. 3 is a graph of SOC values of the battery, which is measured at every unit time. Referring to FIG. 3, it is seen that an SOC value of the battery is frequently changed in a range of about 0% to about 100%.

The measured SOC value of the battery is compared to the plurality of operation ranges stored in the storage unit (see reference numeral 220 of FIG. 5) to determine an operation range corresponding to the measured SOC value among the plurality of operation ranges (S210).

The plurality of operation ranges corresponding to the SOC values of the battery are stored in the storage unit 220. The plurality of operation ranges may be previously set to determine whether the charging/discharging of the battery is compensated.

The plurality of operation ranges will be described with reference to the graph of FIG. 7. Here, an x-axis in the graph may denote a time, and a y-axis in the graph may denote an SOC value of the battery.

Figure 7:
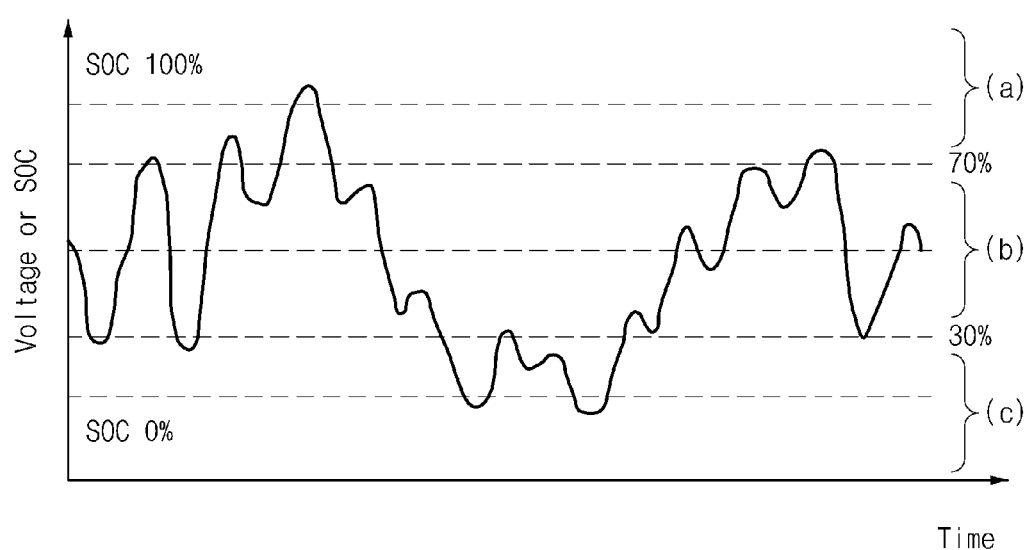
FIG. 7 is a graph of a variation in SOC depending on charging/discharging sections of the battery according to another embodiment of the present invention.

Referring to FIG. 7, the SOC value of the battery may be partitively set to ranges of about 70% to about 100% (a first operation range: a), about 30% to about 70% (a second operation range: b), and about 0% to about 30% (a third operation range: c). Since there are many demands to match the present SOC value of the battery to a level of about 50%, it may be determined that the first operation state is defined as an overcharged state, the second operation range is defined as a normal range, and the third operation range is defined as an overcharged state. In this specification, although the value of each of the operation ranges is set as described above, the present invention is not limited thereto. For example, the values of the operation ranges may be changed in consideration of capacity, charging efficiency, discharging resistance, and the like of the battery.

Next, one correcting part of the SOC correcting unit is selected.

The SOC correcting unit 240 includes a first correcting part 240a, a second correcting part 240b, and a third correcting part 240c. The correcting parts are operated by using charging/discharging power adjusting manners different from each other, respectively.

The first correcting part 240a includes conditions for increasing or decreasing charging/discharging power in an exponential form. The second correcting part 240b includes conditions for increasing or decreasing the charging/discharging power in a stepped form. Also, a third correcting part 240c includes conditions for increasing or decreasing the charging/discharging power at a predetermined ratio.

Then, the SOC correction is performed by using the correction value corresponding to the operation range which corresponds to the measured SOC value of the battery (S220). The SOC correction may adjust the charging/discharging power according to the result determined in the operation S210.

A method for adjusting the charging/discharging power may include various methods set in the SOC correcting unit 240 and will be described with reference to embodiments.

Figure 8A:
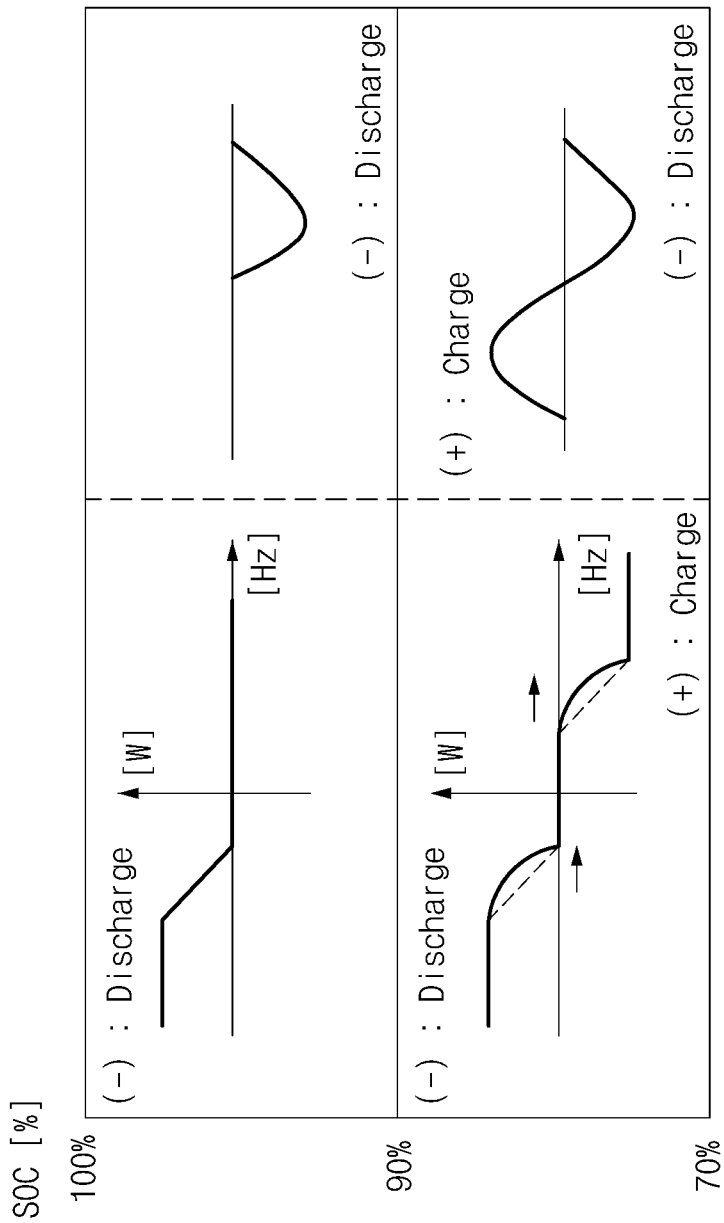
FIGS. 8A to 8C, 9A to 9C, and 10A to 10C are graphs of the method for correcting the SOC of the battery according to another embodiment of the present invention.
Figure 8B:
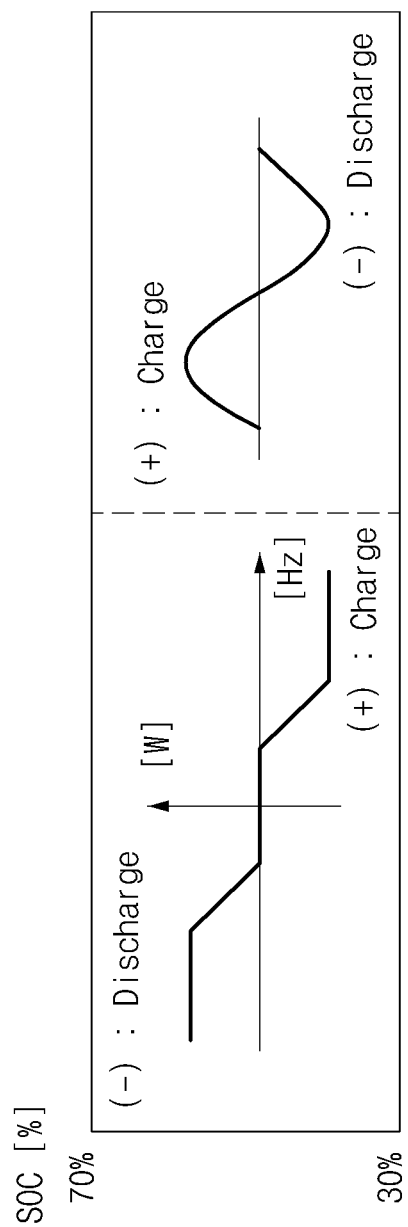
Figure 8C:
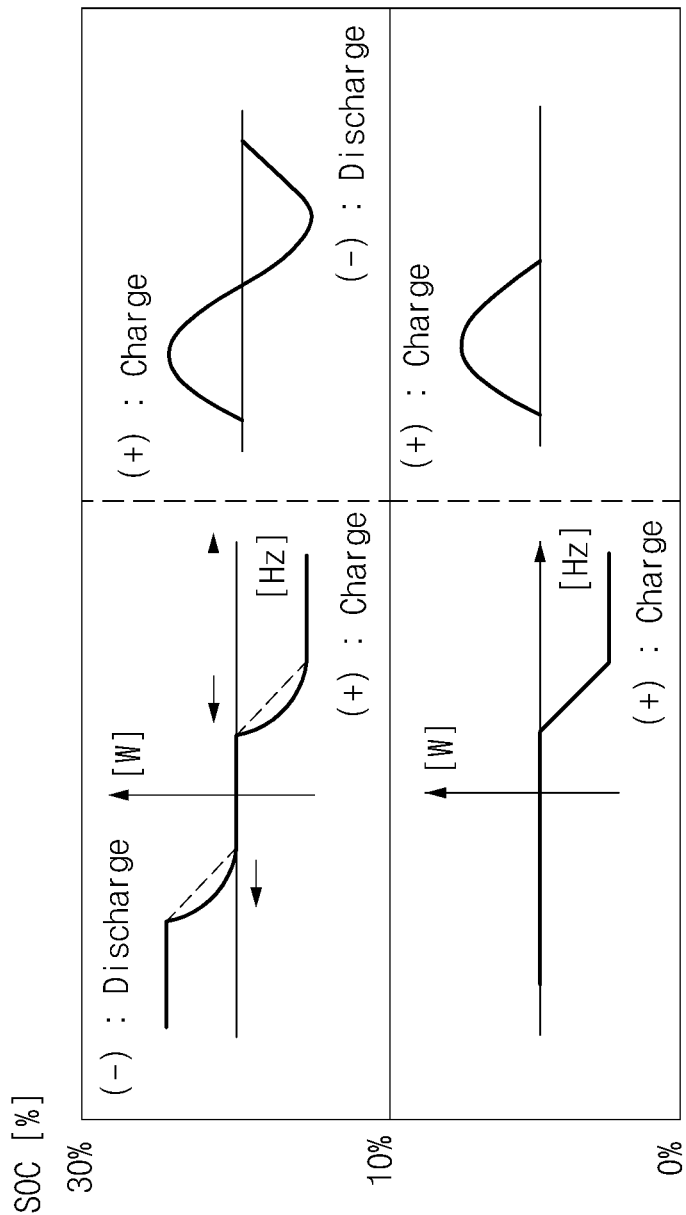

First, FIGS. 8A to 8C are graphs of a method for increasing or decreasing the charging/discharging power in the exponential form.

FIG. 8A illustrates a case in which the SOC value of the battery, which is measured in the SOC measuring unit corresponds to the first operation range a of about 70% to about 100%. When the measured SOC value of the battery corresponds to the first operation range, a correction value by which the charging power is decreased in the exponential form, and the discharging power is increased in the exponential form is applied. The probability that the SOC value of the battery reaches about 100% may be reduced, and the battery may be reduced in capacity when the battery is designed.

FIG. 8B illustrates a case in which the SOC value of the battery, which is measured in the SOC measuring unit corresponds to the second operation range b of about 30% to about 70%. In this case, it is determined as the normal range to maintain the present state.

Next, FIG. 8C illustrates a case in which the SOC value of the battery, which is measured in the SOC measuring unit corresponds to the third operation range c of about 0% to about 30%. In this case, a correction value by which the charging power is increased in the exponential form, and the discharging power is decreased in the exponential form is applied.

Figure 9A:
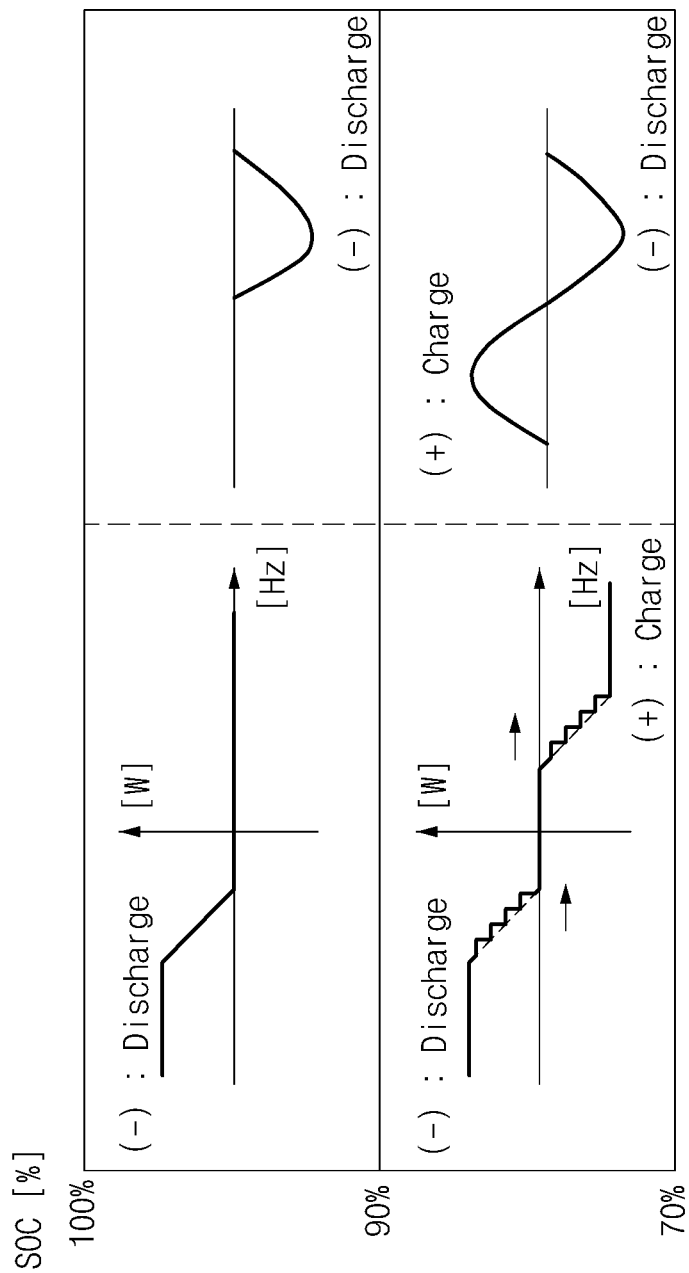
Figure 9B:
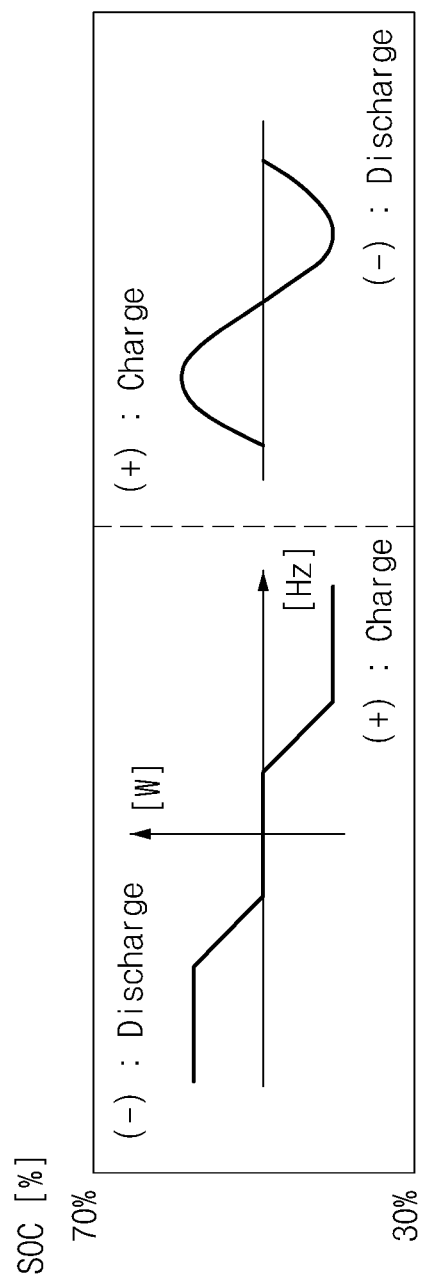
Figure 9C:
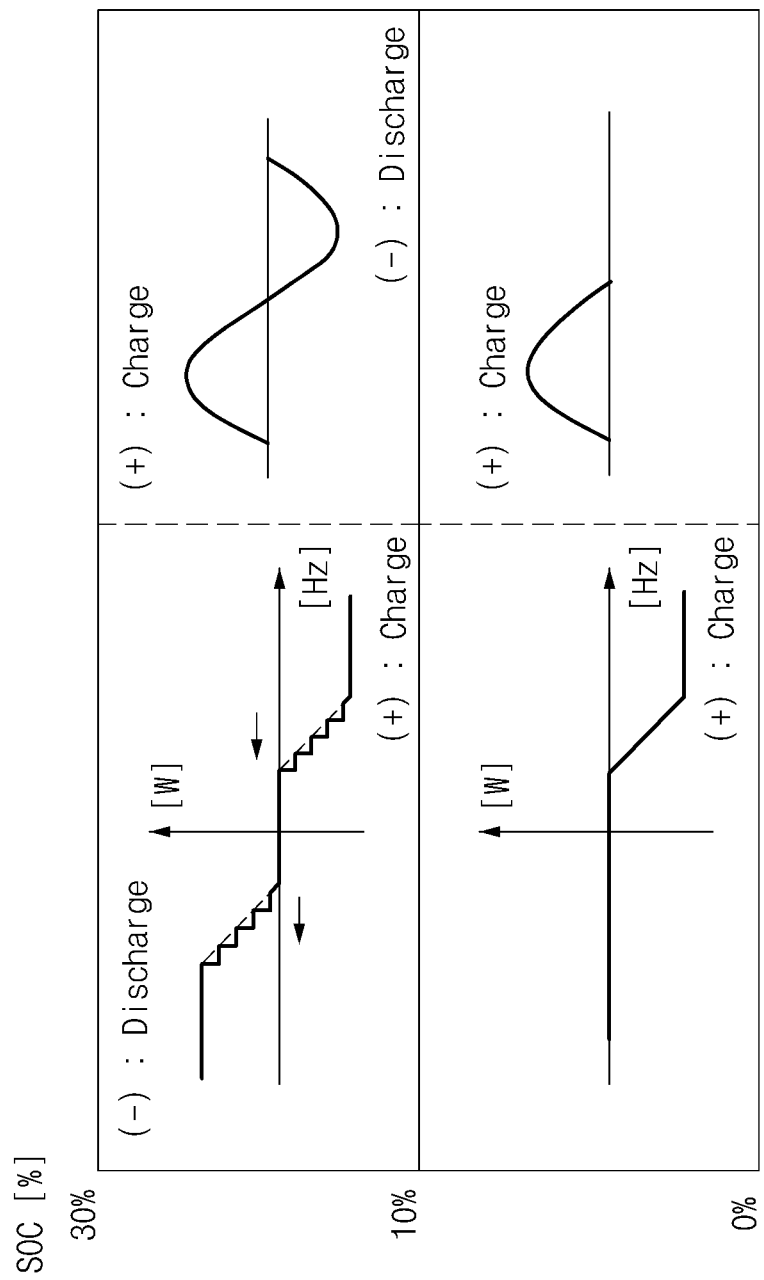

FIGS. 9A to 9C are graphs of a method for increasing or decreasing the charging/discharging power in the stepped form.

FIG. 9A illustrates a case in which the SOC value of the battery, which is measured in the SOC measuring unit corresponds to the first operation range a of about 70% to about 100%. When the measured SOC value of the battery corresponds to the first operation range, a correction value by which the charging power is decreased in the stepped form, and the discharging power is increased in the stepped form is applied.

FIG. 9B illustrates a case in which the SOC value of the battery, which is measured in the SOC measuring unit corresponds to the second operation range b of about 30% to about 70%. In this case, it is determined as the normal range to maintain the present state.

Next, FIG. 9C illustrates a case in which the SOC value of the battery, which is measured in the SOC measuring unit corresponds to the third operation range c of about 0% to about 30%. In this case, a correction value by which the charging power is increased in the stepped form, and the discharging power is decreased in the stepped form is applied.

Figure 10A:
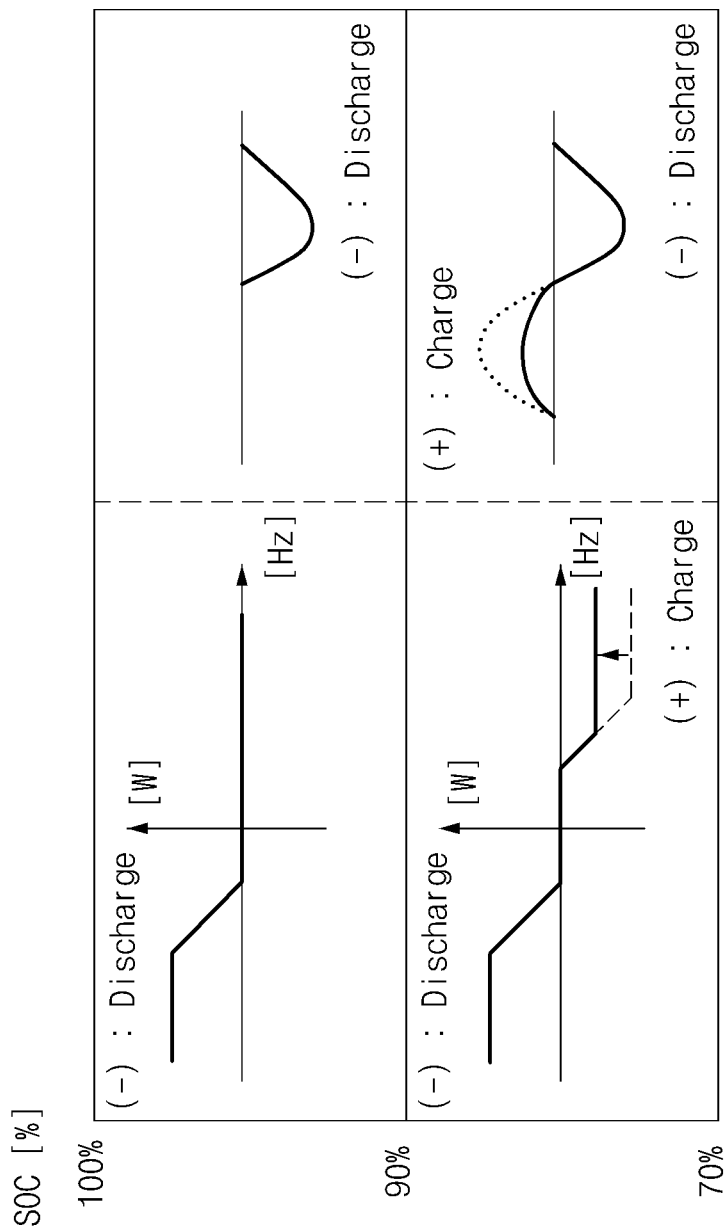
Figure 10B:
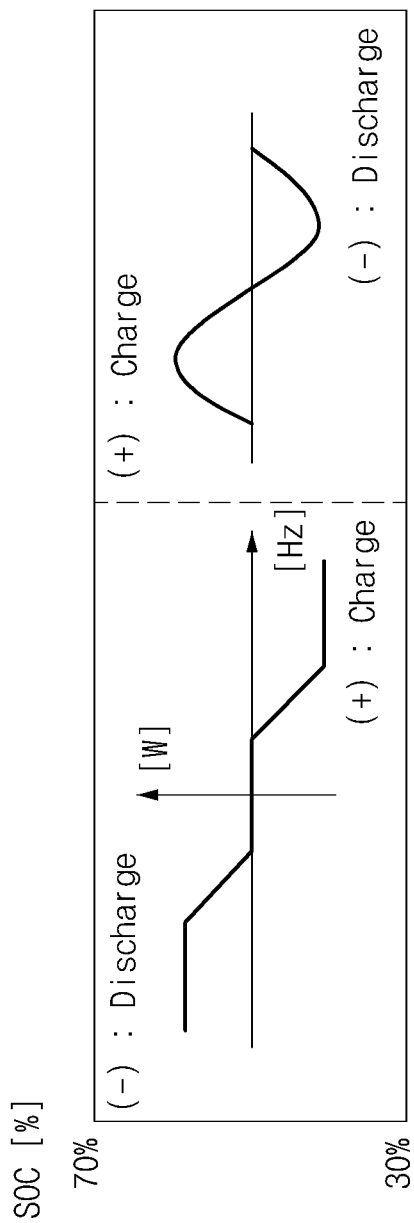
Figure 10C:
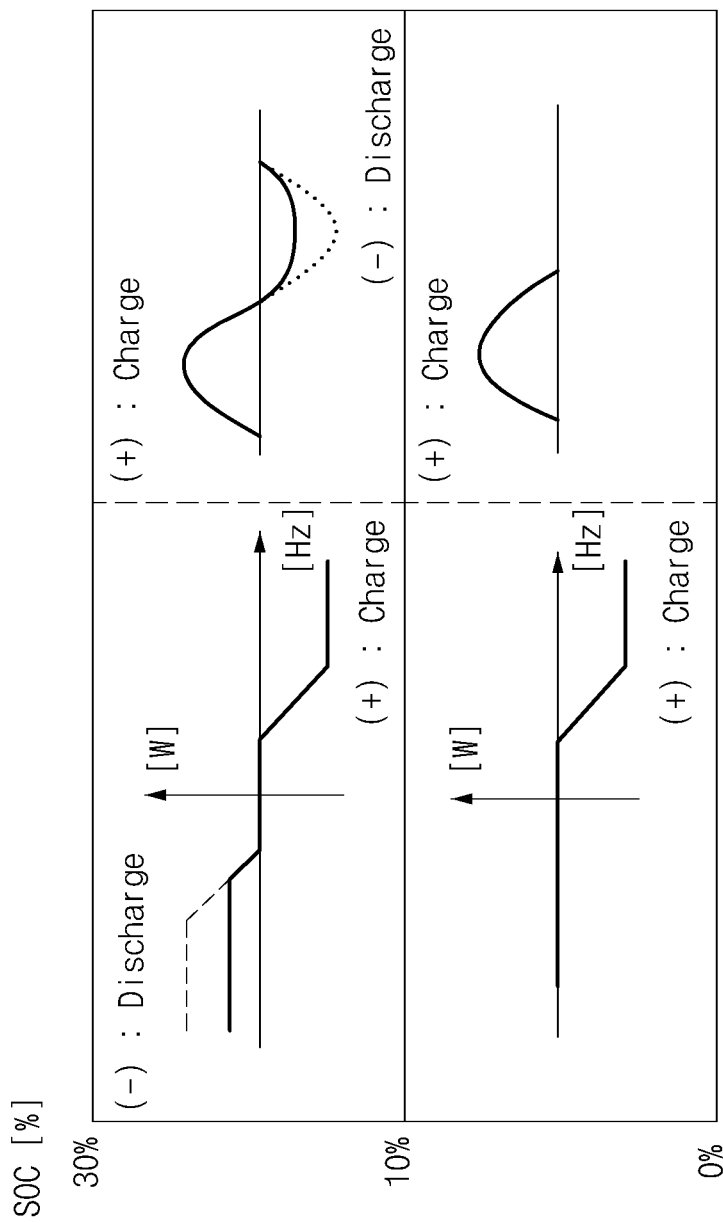

FIGS. 10A to 10C are graphs of a method for increasing or decreasing the charging/discharging power at a predetermined ratio.

FIG. 10A illustrates a case in which the SOC value of the battery, which is measured in the SOC measuring unit corresponds to the first operation range a of about 70% to about 100%. When the measured SOC value of the battery corresponds to the first operation range, a correction value by which the charging power is decreased at a predetermined ratio is applied.

FIG. 10B illustrates a case in which the SOC value of the battery, which is measured in the SOC measuring unit corresponds to the second operation range b of about 30% to about 70%. In this case, it is determined as the normal range to maintain the present state.

Next, FIG. 10C illustrates a case in which the SOC value of the battery, which is measured in the SOC measuring unit corresponds to the third operation range c of about 0% to about 30%. In this case, a correction value by which the discharging power is decreased at a predetermined ratio in comparison to the existing discharging power is applied.

As described above, since the charging/discharging power is adjusted according to the various conditions to perform the SOC correction, the SOC value of the battery may be maintained within a predetermined range. In addition, the probability that the SOC value of the battery reaches about 100% or about 0% may be reduced, and the battery may be reduced in capacity when the battery is designed.

The above-disclosed subject matter is to be considered illustrative, and not restrictive, and the appended claims are intended to cover all such modifications, enhancements, and other embodiments, which fall within the true spirit and scope of the present invention.

Thus, the embodiment of the present invention is to be considered illustrative, and not restrictive, and the technical spirit of the present invention is not limited to the foregoing embodiment.

Therefore, the scope of the invention is defined not by the detailed description of the invention but by the appended claims, and all differences within the scope will be construed as being included in the present invention.

The invention claimed is:

1. A system for correcting a state-of-charging (SOC) of a battery, the system comprising:
    an SOC measuring unit configured to measure an SOC value of the battery;
    a storage unit configured to store preset operation ranges to determine whether charging/discharging of the battery is compensated;
    a determining unit configured to determine an operation range corresponding to the SOC value of the battery among the preset operation ranges, the determined operation range being a range on which a dead band in charging/discharging directions is based, a frequency correction signal range corresponding to a range of the dead band in charging/discharging directions being used to adjust an amount of a power signal applied to the battery; and
    an SOC correcting unit configured to selectively adjust the charging/discharging directions and charging/discharging power according to the range of the dead band and the frequency correction signal range, based on the operation range determined in the determining unit to correct the SOC value of the battery.

2. The system of claim 1, wherein the storage unit comprises a first operation range, a second operation range, and a third operation range.

3. The system of claim 2, wherein the first operation range is about 70% to about 100% of the SOC value, the second operation range is about 30% to about 70% of the SOC value, and the third operation range is about 0% to about 30% of the SOC value.

4. The system of claim 2, wherein the SOC correcting unit is set to correction values different from each other according to the operation ranges.

5. The system of claim 4, wherein, when the operation range is determined as the first operation range in the determining unit, a first correction value by which a dead band is increased in the charging direction is applied.

6. The system of claim 4, wherein, when the operation range is determined as the second operation range in the determining unit, a second correction value by which a dead band is increased in the charging direction, or the present state is maintained is applied.

7. The system of claim 4, wherein, when the operation range is determined as the third operation range in the determining unit, a third correction value by which a dead band is decreased in the charging direction or increased in the discharging direction is applied.

8. The system of claim 2, wherein the SOC correcting unit adjusts the charging/discharging power in an exponential or stepped form or at a predetermined ratio.

9. The system of claim 8, wherein, when the operation range is determined as the first operation range in the determining unit, a correction value by which the charging power is decreased, and the discharging power is increased is applied.

10. The system of claim 8, wherein, when the operation range is determined as the second operation range in the determining unit, a correction value by which the present state is maintained is applied.

11. The system of claim 8, wherein, when the operation range is determined as the third operation range in the determining unit, a correction value by which the charging power is increased, and the discharging power is decreased is applied.

12. A method for correcting an SOC of a battery, the method comprising:
    measuring an SOC value of the battery;
    comparing the SOC value to preset operation ranges to determine an operation range corresponding to the SOC value, the determined operation range being a range on which a dead band in charging/discharging directions is based, a frequency correction signal range corresponding to a range of the dead band in charging/discharging directions being used to adjust an amount of a power signal applied to the battery; and
    selectively adjusting the charging/discharging directions and charging/discharging power according to the range of the dead band and the frequency correction signal range, based on the operation range which corresponds to the SOC value to correct the SOC value of the battery.

13. The method of claim 12, wherein the preset operation ranges comprise a first operation range, a second operation range, and a third operation range, and
    wherein the first operation range is about 70% to about 100% of the SOC value, the second operation range is about 30% to about 70% of the SOC value, and the third operation range is about 0% to about 30% of the SOC value.

14. The method of claim 13, wherein, when the operation range is determined as the first operation range, a first correction value by which a dead band is increased in the charging direction is applied.

15. The method of claim 13, wherein when the operation range is determined as the second operation range, a second correction value by which a dead band is increased in the charging/discharging directions, or the present state is maintained is applied.

16. The method of claim 13, wherein, when the operation range is determined as the third operation range, a third correction value by which a dead band is decreased in the charging direction or increased in the discharging direction is applied.

17. The method of claim 13, wherein the correcting of the SOC value of the battery comprises adjusting the charging/discharging power in an exponential or stepped form or at a predetermined ratio.

18. The method of claim 17, wherein, when the operation range is determined as the first operation range, a correction value by which the charging power is decreased, and the discharging power is increased is applied.

19. The method of claim 17, wherein, when the operation range is determined as the second operation range, a correction value by which the present state is maintained is applied.

20. The method of claim 17, wherein, when the operation range is determined as the third operation range, a correction value by which the charging power is increased, and the discharging power is decreased is applied.

* * * * *